US005564098A

United States Patent [19]
Rodal et al.

[11] Patent Number: 5,564,098
[45] Date of Patent: Oct. 8, 1996

[54] ULTRA LOW-POWER INTEGRATED CIRCUIT FOR PSEUDO-BASEBAND DOWN-CONVERSION OF GPS RF SIGNALS

[75] Inventors: Eric B. Rodal, Cupertino; Gary L. Wagner, Menlo Park; Chung Y. Lau, Sunnyvale, all of Calif.

[73] Assignee: Trimble Navigation Limited, Sunnyvale, Calif.

[21] Appl. No.: 305,356

[22] Filed: Sep. 13, 1994

[51] Int. Cl.$^6$ ............................................. H04B 1/26
[52] U.S. Cl. .................... 455/314; 455/207; 455/303; 375/261
[58] Field of Search ............................. 455/302, 303, 455/207, 209, 323, 313, 314, 315, 316, 317, 318, 319; 375/261

[56] References Cited

U.S. PATENT DOCUMENTS 4,754,465  6/1988  Trimble .
4,785,463  11/1988  Janc et al. .
5,192,957  3/1993  Kennedy .
5,311,149  5/1994  Wagner et al. ...................... 455/260

Primary Examiner—Andrew Faile
Assistant Examiner—Tri Nguyen
Attorney, Agent, or Firm—Thomas E. Schatzel; Law Offices of Thomas E. Schatzel

[57] ABSTRACT

A GPS receiver downconverter combines on a single integrated circuit, a first super-heterodyne mixer, a voltage controlled oscillator, a phase locked loop, a pair of quadrature mixers and a pair of quantizers with in-phase and quadrature-phase sampler outputs operable at twenty-five MHz and 2.5 MHz. Emitter-coupled logic and special low-voltage bipolar semiconductor technology are combined for 3.3 volt operation at under one hundred milliwatts.

5 Claims, 1 Drawing Sheet

ULTRA LOW-POWER INTEGRATED CIRCUIT FOR PSEUDO-BASEBAND DOWN-CONVERSION OF GPS RF SIGNALS

BACKGROUND OF THE INVENTION

1. Field of the Invention

The invention relates generally to integrated circuit semiconductor devices and more specifically to global positioning system receivers and radio frequency down-conversion of satellite transmissions to pseudo-baseband signals.

2. Description of the Prior Art

Global positioning system receivers use signals received from typically three or more overhead satellites to determine navigational data such as position and velocity. Such systems may also provide altitude and time. GPS signals are available worldwide at no cost and can be used to determine the location of a vehicle, such as a car or truck, to within one city block, or better. Dual-frequency carrier GPS receivers typically track a pair of radio carriers, L1 and L2, associated with the GPS satellites, to generate accumulated delta-range measurements (ADR) from P-code modulation on those carriers and at the same time track L1 coarse acquisition code (C/A-code) to generate code phase measurements. Carrier L1 is positioned at 1575.42 MHz and carrier L2 is positioned at 1227.78 MHz. Less expensive receivers tune only one carrier frequency, and therefore cannot compute for themselves the local ionospheric delays that will appear as position errors. At such carrier frequencies, radio carriers travel by line-of-sight.

The constellation of GPS satellites in orbit about the earth comprises individual satellites that each transmit a unique identifying code in a code multiple access arrangement (CDMA). This allows the many GPS satellites to all transmit in spread spectrum mode at the same frequency (plus or minus a Doppler shift of that frequency as results from the satellite's velocity). Particular satellites are sorted out of the jumble of signals and noise by correlating the received signal to a set of predefined codes that are matched to individual GPS satellites. These codes can be out of phase with the signals. Therefore, "finding" a GPS satellite initially involves searching various carrier frequencies, to account for Doppler shift and oscillator inaccuracies, and search for a code match, using 1023 different code phases and thirty or more code templates.

The limited amount of energy that can be stored and delivered from a battery continues to severely constrain the single-charge field life of portable handheld GPS navigation receivers. Typical units can now operate continuously for only a few hours. The field life can be extended in handheld GPS receivers by packing a relatively larger battery, carrying spare batteries, field-charging the batteries such as by using solar cells, and/or by reducing the current drawn by the electronics.

Conventional battery-saving techniques include the use of inherently lower-power semiconductor technologies, e.g., CMOS, and system management wherein system elements are powered-off when not being used.

SUMMARY OF THE PRESENT INVENTION

It is therefore an object of the present invention to provide an integrated circuit for reducing the power required by a battery-operated GPS receiver.

Another object of the present invention is to provide a single integrated circuit device that integrates much of the radio frequency down-conversion and in-phase/quadrature-phase sampling functions associated with GPS satellite signal processing.

Briefly, a GPS receiver downconverter embodiment of the present invention combines, on a single integrated circuit, a first super-heterodyne mixer, a voltage controlled oscillator, a phase locked loop, a pair of quadrature mixers and a pair of quantizers with in-phase and quadrature-phase sampler outputs operable at twenty-five MHz and 2.5 MHz.

An advantage of the present invention is that a whole radio frequency down-conversion function is provided on a single-chip integrated circuit that has substantially lower system power consumption, compared to the prior art.

Another advantage of the present invention is that a radio frequency down-conversion integrated circuit is provided that has in-phase and quadrature-phase sampler outputs operable at twenty-five MHz for normal mode and 2.5 MHz for a lower-power mode.

A further advantage of the present invention is that a single-chip GPS digital integrated circuit is provided that has improved reliability, where fewer packages and fewer interface circuitry and lower power dissipation translate directly into improved reliability.

Another advantage of the present invention is that a GPS digital integrated circuit is provided that has significant system cost savings. The resulting single-chip costs much less than the sum of the parts it replaces.

A still further advantage of the present invention is that a single-chip GPS digital integrated circuit is provided that is susceptible to integrated circuit process improvements.

Another advantage of the present invention is that a single-chip GPS device is provided that is small in size.

Another advantage of the present invention is that a single-chip GPS digital integrated circuit is provided that can operate on a single three volt power supply.

These and other objects and advantages of the present invention will no doubt become obvious to those of ordinary skill in the art after having read the following detailed description of the preferred embodiment which is illustrated in the drawing figures.

IN THE DRAWINGS

FIG. 1 is a block diagram of a radio frequency down-conversion integrated circuit embodiment of the present invention.

DETAILED DESCRIPTION OF THE PREFERRED EMBODIMENT

Figure 1:
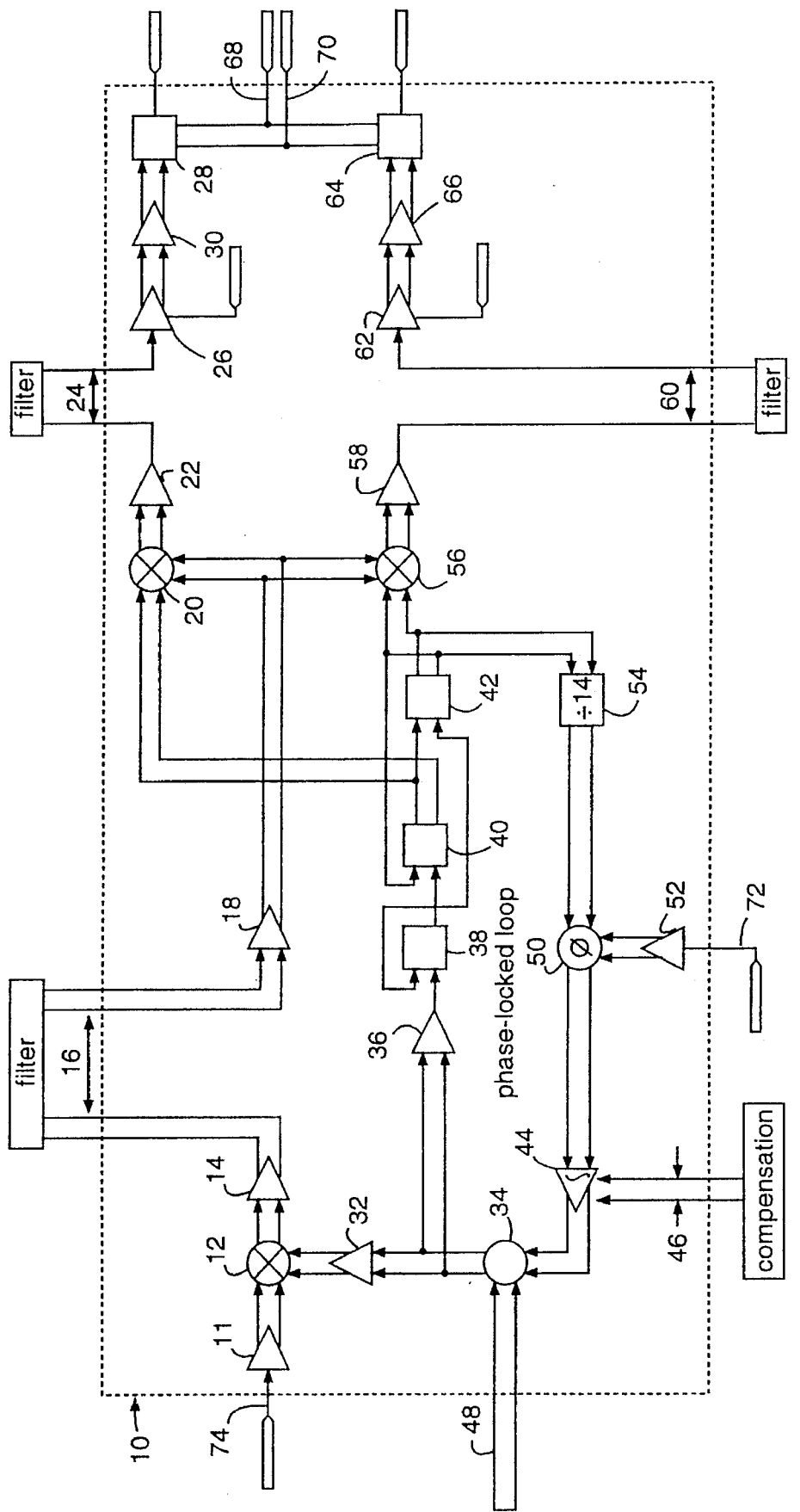

FIG. 1 illustrates a radio frequency down-conversion integrated circuit (IC) embodiment of the present invention, referred to herein by the general reference numeral 10. The IC 10 is suitable for use in a global positioning system (GPS) satellite navigation receiver. Its purpose is to amplify L-band microwave radio transmissions received in an antenna from orbiting GPS satellites and to downconvert them to a pseudo-baseband signal for sampling.

The whole of IC 10 is preferably implemented as a single semiconductor chip using a low voltage, e.g., 3.3 volt, bipolar process and emitter-coupled logic (ECL) design. Commercial semiconductor fabrication processes and packaging facilities available in the United States, such as provided by AT&T Microelectronics (Allertown, Pa.), may be successfully used to fabricate IC 10. Where special 3.3 volt logic, mixers and amplifiers is not available as a standard cell, currently available logic implementations for five volt operation are preferably modified to eliminate any totem-pole stacking of transistors that would prevent a minimum Vce across any transistor to be less than 0.5 volts with a 3.3 volt supply voltage. For example, logic designs that use four levels of transistors to implement an AND-gate should be adjusted to use three or less levels. Radio frequency mixer circuits that use parallel designs are also preferred over series designs that require greater than 3.3 volts for proper operation.

The IC 10 comprises a radio frequency (RF) pre-amplifier 11 for L-band microwave signals, a first mixer 12 for down-conversion to 175 MHz, an intermediate frequency (IF) amplifier 14, an external off-chip bandpass filter connection 16, an IF amplifier 18, an in-phase (I) quadrature mixer 20, a pseudo-baseband amplifier 22, an external off-chip baseband filter connection 24, a pseudo-baseband amplifier 26, an I-sample/amplifier stage 28 and a quantizer 30. The local oscillator frequency synthesizer section comprises a local oscillator (LO) amplifier 32, a voltage-controlled oscillator (VCO) 34, an amplifier 36, a set of three cascaded flip-flops 38, 40 and 42 arranged in a divide-by-eight, a low-pass integrating amplifier 44 with an external off-chip compensation connection 46, an external off-chip resonator connection 48, a phase detector 50, a reference frequency amplifier 52, and a divide by fourteen counter 54. The IC 10 further comprises a quadrature-phase (Q) quadrature mixer 56, a pseudo-baseband amplifier 58, an external off-chip baseband filter connection 60, a pseudo-baseband amplifier 62, a Q-sample/amplifier stage 64 and a quantizer 66. The outputs of quantizers 30 and 66 are preferably transistor-transistor logic (TTL) or complementary metal-oxide-semiconductor (CMOS) compatible.

A line 68 is used externally to select whether the I-sample/amplifier stage 28 and Q-sample/amplifier stage 64 are to operate as samplers or as amplifiers. When operated as samplers, the power consumption of the IC 10 is reduced, as the high-frequency, power-consuming signals driven out by quantizers 30 and 66 are eliminated and can change only at the sample clock rate.

A line 70 is used to receive externally generated sample clocks. The line 70 may be operated at twenty-five MHz for normal mode, or at a reduced 2.5 MHz to further reduce the power consumed by the IC 10, or at some other frequencies that provide a desired level of performance.

The overall power consumption of the IC 10 is preferably no more than one hundred milliwatts, and when combined with a digital signal processing (DSP) unit that extracts GPS navigation information from the I and Q sample outputs from quantizers 30 and 66, the system power consumption does not exceed three hundred milliwatts. A DSP unit capable of operating in conjunction with the IC 10 is described in the U.S. patent application, Ser. No. 08/165,972, now U.S. Pat. No. 5,504,684 filed Dec. 10, 1993, and titled "SINGLE-CHIP GPS RECEIVER DIGITAL SIGNAL PROCESSING AND MICROCOMPUTER", and is incorporated herein by reference.

During acquisition and tracking of a particular GPS satellite vehicle (SV), the IC 10 and its associated DSP are operated to find a Doppler-influenced GPS carrier frequency and C/A code phase from the GPS SV. As is conventional, such a GPS receiver searches over a range of frequencies, a range that is widened by local oscillator uncertainties when first starting up. A range of 1023 code phases is searched, chip-by-chip, until a signal from the expected GPS SV is found. If the expected GPS SV is not found, C/A codes for other likely candidate satellite vehicles are tried. This search is carried out by super-heterodyne mixing the received signal with various local oscillator frequencies and correlating a detected signal in the DSP with a trial C/A code that is predicted to be valid for the locale. The correlation interval is typically one millisecond, and is the periodicity of the C/A code.

A line 72 is used to receive an external generated reference frequency. e.g., 12.5 MHz as generated by a temperature controlled crystal oscillator (TCXO).

A line 74 is used to input the RF signals of an external antenna in receipt of GPS satellite transmissions, e.g., single-ended fifty ohm impedance terminated.

Given that each GPS satellite transmits on two frequencies, L1 at 1575.42 MHz and L2 at 1227.6 MHz, operating the VCO 34 at 1400 MHz will produce a first intermediate frequency of 175.42 MHz or 172.4 MHz, respectively, that is output by the first IF mixer 12. The divide-by-eight action of the flip-flops 38, 40 and 42 causes a second intermediate frequency output of approximately 420 KHz or 2.6 MHz to appear out of the mixers 20 and 56. This product is a pseudo-baseband signal and is necessary because the velocity of the orbiting GPS satellites can have a Doppler-shifted carrier. Therefore, to prevent folding the second intermediate frequency through DC, the nominal second intermediate frequency is elevated above DC and the offset is removed digitally in subsequent digital signal processing (DSP).

Monolithic integrated circuits (ICs) that include radio frequency (RF) amplifiers operating above one gigahertz and with very low signal levels can benefit from an all-differential signal processing configuration. For example, RF and intermediate frequency (IF) amplifiers with differential inputs and outputs exhibit better noise immunity and tend to generate less spurious noise. Emitter-coupled transistor pairs naturally accept a differential input between the respective transistor bases, and produce a differential output between the transistor collectors.

A majority of the connections between the elements of the IC 10 are implemented with two lines driven differentially. This reduces the noise susceptibility and allows low power operation. Such differential drive connections are shown in FIG. 1 as a pair of parallel lines between the main circuit blocks.

Although the present invention has been described in terms of the presently preferred embodiment, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A radio frequency down-conversion integrated circuit (IC) for use in a satellite navigation receiver to amplify L-band microwave radio transmissions received from orbiting satellites and to downconvert such signals to a pseudo-baseband signal for sampling, comprising:

a low-voltage bipolar-process emitter-coupled-logic (ECL) single semiconductor chip (10);

a radio frequency (RF) pre-amplifier (11) disposed in the IC 10 and connected to amplify signals from an L-band microwave signal input (74);

a first mixer (12) disposed in the IC (10) and connected to a first output (32) from a local oscillator frequency synthesizer section (32–54) and the RF preamplifier (11) for down-conversion of signals from said L-band microwave signal input (74) to approximately 175 MHz;

an intermediate frequency (IF) amplifier (14) disposed in the IC (10) and connected to the first mixer (12) and having an external off-chip bandpass filter connection (16);

an IF amplifier (18) disposed in the IC (10) and connected to said external off-chip bandpass filter connection (16);

an in-phase (I) quadrature mixer (20) disposed in the IC (10) and connected to the IF amplifier (18) and a second output (40) from said local oscillator frequency synthesizer section (32–54);

a pseudo-baseband amplifier (22) disposed in the IC (10) and connected to amplify signals from the in-phase (I) quadrature mixer (20) to an external off-chip baseband filter connection (24);

a pseudo-baseband amplifier (26) connected to an I-sample/amplifier stage (28) and a quantizer (30) and all disposed in the IC (10) and connected to a control line (68) that provides for an external selection of whether said I-sample/amplifier stage (28) is to operate as a sampler or as an amplifier, wherein when operated as a sampler, the overall power consumption of the IC (10) is reduced, as the high-frequency, power-consuming signals driven out by quantizer (30) is eliminated and can change only at a sample clock rate;

a quadrature-phase (Q) quadrature mixer (56) disposed in the IC (10) and connected to the IF amplifier (18) and a third output (42) from said local oscillator frequency synthesizer section (32–54);

a pseudo-baseband amplifier (58) connected to an external off-chip baseband filter connection (60); and a pseudo-baseband amplifier (62) connected to a Q-sample/amplifier stage (64) and a quantizer (66) and all disposed in the IC (10) and connected to said control line (68) that further provides for an external selection of whether said Q-sample/amplifier stage (64) is to operate as a sampler or as an amplifier, wherein when operated as a sampler, the overall power consumption of the IC (10) is reduced, as the high-frequency, power-consuming signals driven out by quantizer (66) is eliminated and can change only at said sample clock rate.

2. The IC of claim 1, wherein:

said local oscillator frequency synthesizer section (32–54) comprises a local oscillator (LO) amplifier (32), a voltage-controlled oscillator (VCO) (34), an amplifier (36), a set of three cascaded flip-flops (38, 40 and 42) arranged in a divide-by-eight, a low-pass integrating amplifier (44) with an external off-chip compensation connection (46), an external off-chip resonator connection (48), a phase detector (50), a reference frequency amplifier (52), and a divide by fourteen counter (54).

3. The IC of claim 1, wherein:

the radio frequency (RF) pre-amplifier (11) amplifies a separate first and second pair of microwave radio carriers that are nominally 1575.42 MHz and 1227.6 MHz;

said first output (32) from said local oscillator frequency synthesizer section (32–54) provides a first frequency synthesizer beat frequency of approximately 1400 MHz;

said second output (40) from said local oscillator frequency synthesizer section (32–54) provides a second frequency synthesizer beat frequency of approximately 175 MHz and one-eighth of said first beat frequency;

said third output (42) from said local oscillator frequency synthesizer section (32–54) provides a third frequency synthesizer beat frequency of approximately 175 MHz in quadrature to said second frequency synthesizer beat frequency and one-eighth of said first beat frequency; and the pseudo-baseband amplifiers (22, 58) provide baseband signals that are nominally centered at 420 KHz and 2.6 MHz, respectively for said first and second pair of microwave radio carriers.

4. The IC of claim 1, wherein:

said I-sample/amplifier stage (28) and said Q-sample/amplifier stage (64) are connected to receive sampling clocks of approximately twenty-five MHz for a normal mode and 2.5 MHz for a low-power mode operation.

5. The IC of claim 1, wherein:

said local oscillator frequency synthesizer section (32–54) comprises a voltage controlled oscillator (34) operated at approximately 1400 MHz with an external off-chip resonator (48) and connected to a phase detector (50) and digital divider (38, 40, 42) in a phase-locked loop configuration and a connection (72) on said phase detector (50) to receive (52) an external 12.5 MHz reference frequency.

* * * * *